United States Patent [19]

Odaira et al.

[11] Patent Number: 5,333,379
[45] Date of Patent: Aug. 2, 1994

[54] METHOD OF PRODUCING A THREE-DIMENSIONAL WIRING BOARD

[75] Inventors: Hiroshi Odaira, Chigasaki; Yoshizumi Sato, Tokyo, both of Japan

[73] Assignee: Kabushiki Kaisha Toshiba, Kanagawa, Japan

[21] Appl. No.: 863,904

[22] Filed: Apr. 6, 1992

[30] Foreign Application Priority Data

Apr. 8, 1991 [JP] Japan ................. 3-074848

[51] Int. Cl.$^5$ ............... B29C 67/22; H05K 3/30
[52] U.S. Cl. ........................ 29/841; 29/832; 264/46.6; 264/104; 264/263; 264/272.17
[58] Field of Search ............. 264/263, 272.17, 104, 264/46.4, 46.5, 46.6; 437/183, 209, 203; 29/829, 846, 830, 832, 841, 848

[56] References Cited

U.S. PATENT DOCUMENTS

| | | | |
|---|---|---|---|
| 3,324,014 | 6/1967 | Modjeska | 29/848 |
| 3,466,206 | 9/1969 | Beck | 29/846 |
| 3,621,564 | 11/1971 | Tanaka et al. | 29/832 |
| 3,800,020 | 3/1974 | Parfet | 264/104 |
| 3,889,363 | 6/1975 | Davis | 264/104 |
| 3,965,277 | 6/1976 | Guditz et al. | 264/272.17 |
| 4,067,945 | 1/1978 | Durocher | 264/104 |
| 4,141,782 | 2/1979 | Dugan et al. | 29/830 |
| 4,346,516 | 8/1982 | Yokouchi et al. | 264/263 |
| 4,546,065 | 10/1985 | Amendola et al. | 29/848 |
| 4,635,356 | 1/1987 | Ohuchi et al. | 29/841 |
| 4,778,641 | 10/1988 | Chia | 264/272.17 |
| 4,784,972 | 11/1988 | Hatada | 437/183 |
| 4,814,295 | 3/1989 | Mehta | 29/832 |
| 4,857,482 | 8/1989 | Saito et al. | 264/272.11 |
| 5,031,308 | 7/1991 | Yamashita et al. | 29/830 |
| 5,065,505 | 11/1991 | Matsubara et al. | 29/830 |

FOREIGN PATENT DOCUMENTS

| | | | |
|---|---|---|---|
| 2347049 | 2/1975 | Fed. Rep. of Germany | 29/841 |
| 53-023565 | 3/1978 | Japan | 29/832 |
| 59-194447 | 11/1984 | Japan | 437/203 |
| 61-288489 | 12/1986 | Japan | 264/104 |
| 3-78289 | 4/1991 | Japan . | |
| 3-78291 | 4/1991 | Japan . | |
| 3-84989 | 4/1991 | Japan . | |
| 745773 | 2/1956 | United Kingdom | 29/846 |
| 2222727 | 3/1990 | United Kingdom | 29/846 |
| 86/02518 | 4/1986 | World Int. Prop. O. | 29/830 |

Primary Examiner—Allan R. Kuhns
Attorney, Agent, or Firm—Finnegan, Henderson Farabow, Garrett & Dunner

[57] ABSTRACT

Small projections are arranged on a molding surface of at least one of an upper die half and a lower die half constituting a molding die, and a predetermined number of conductor circuits each including small projections are formed on the molding surface by electrically plating. A predetermined number of conductor circuits are formed on the molding surface of other die half in the same manner. Subsequently, the molding surfaces of both the die halves are brought in pressure contact with each other so that the electrically plated layers each including small projections on the molding surface are connected electrically. Thereafter, the hollow space between both the die halves is filled with a predetermined resin, whereby the conductor circuits are reversely secured to the resultant molded product to complete production of a three-dimensional wiring board. After electronic components are assembled on the three-dimensional wiring board, the resin is removed from the molded product by dissolving the resin. Consequently, a hollow three-dimensional wiring structure is formed. Thus, three-dimensional conductor circuits which are electrically connected to each other at predetermined positions are formed on the front and rear surfaces of molded product. Thus, the three-dimensional wiring board can be produced at a high efficiency without any necessity for complicated steps and actuation. An electronic circuit module produced by assembling electronic components on the three-dimensional wiring board assures that signals can be processed at a high speed.

8 Claims, 5 Drawing Sheets

METHOD OF PRODUCING A THREE-DIMENSIONAL WIRING BOARD

BACKGROUND OF THE INVENTION

1. Field of the Invention

The present invention relates to a method of producing a wiring board having a three-dimensional structure. Further, the present invention relates to an electronic circuit module for which a three-dimensional wiring board produced by employing the foregoing method is used.

2. Description of the Related Art

A wiring board having a three-dimensional structure with a predetermined number of conductor circuits arranged on the surface of a molded product (molded article) molded of an electrical insulating resin so as to improve a space utilization efficiency, and moreover, serve not only as a mechanical component effective for the purpose of mechanical protection from undesirable breakage or damage but also as a circuit wiring component has been heretofore put in practical use.

To improve performances of the three-dimensional wiring board such as a wiring density and others, conductor circuits are arranged on the opposite surfaces of the wiring board such that they are electrically connected to each other.

A conventional method of producing a three-dimensional wiring board of the aforementioned type has been heretofore practiced in the following manner.

First, an electrical conductive metallic material layer is formed on the surface of a molded product obtained by molding an electrical insulating resin while having a perforated three-dimensional substrate structure by way of steps of chemical plating (non-electrolytic plating) and electrical plating (electrolytic plating). Subsequently, an etching resist is printed on the electrical conductive metallic material which in turn is subjected to exposing treatment and developing treatment, and thereafter, unnecessary parts are removed by employing an etching process, from the regions where conductor circuits are formed. Finally, the remaining etching resist is removed away from the surface of the molded product, whereby production of a three-dimensional wiring board is completed.

However, the conventional method as mentioned above has such a problem that many complicated treatment steps comprising a step of roughing the surface of the molded product, an activating treatment step, a sensitizing treatment step, a chemical plating step and an electrical plating step are required for forming conductor circuits on the surface of the molded product obtained by molding an electrical insulating resin.

In addition, since the surface of the molded product obtained by molding an electrical insulating resin is built in the three-dimensional configuration, it is difficult to uniformly coat the surface of the molded product with an etching resist, and moreover, it is also difficult to produce a mask for effectively masking the three-dimensional surface of the molded product during exposing treatment. For this reason, conductor circuits can be arranged only on a comparatively flat part of the surface of the molded product. Another problem of the conventional method is such that chemical roughing treatment to be conducted for bringing a plated film in close contact with the surface of the molded product at the preceding stage of the chemical plating process requires means differing from resin to resin, and moreover, the kind of a resin for enabling the surface of the molded product to be roughed is imitatively restricted only to an ABS resin, a polysulfon resin, a polyacetal resin or the like.

In view of the aforementioned problems, in contrast with the conventional method of forming conductor circuits directly on the surface of a molded product obtained by molding an electrical insulating resin by way of a chemical plating step and others, a proposal has been made with respect to a method of reversely securing conductor circuits to the surface of a molded product molded by employing an injection molding process.

For example, a method of producing a three-dimensional wiring board wherein the method is practiced by way of a step of adhesively forming a film of an electrical insulating inorganic material having a reverse pattern relative to a required conductor circuit on the molding surface of at least one of a upper die half and lower die half constituting an injection molding die, a step of electrically plating the molding surface of the die half of the injection molding die having the film of an electrical insulating inorganic material adhesively formed thereon with a reverse pattern relative to the required conductor circuit to adhesively form the required conductor circuit on the molding surface of the injection molding die and a step of assembling the die half having a conductor circuit adhesively formed therein with the other molding die half of the injection molding die so as to allow a predetermined resin to be injected into the assembled injection molding die while reversely securing the conductor circuit to the surface of a molded product has been disclosed (see official gazettes of Japanese Unexamined Publication Patent (Kokai) No. Hei 3-78289 and Japanese Unexamined Publication Patent (Kokai) No. Hei 3-78291). With respect to these methods described above, however, no consideration has been taken on the formation of a three-dimensional wiring board having a multi-layered structure and an electronic circuit module including three-dimensionally wired conductor circuits for processing signals at a high speed.

In practice, there are many cases where electronic components are assembled on conductor circuits arranged on a multi-layered wiring board like a three-dimensional wiring board to construct an electronic circuit module including three-dimensionally wired conductor circuits.

With respect to the electronic circuit module as mentioned above, it is often required that a gas having a lowest specific dielectric constant is used as an electrical insulating layer in order to process signals at a high speed. Generally, an organic or inorganic high molecular weight material is used for the three-dimensional wiring board as an electrical insulating material to be interposed between adjacent conductor circuits. However, in view of the fact that signals are processed at a high speed in an electronic circuit module having a three-dimensional wiring board of the foregoing kind used therefor in proportion to $1/\sqrt{\epsilon}$ ($\epsilon e$: fraction of the specific dielectric constant of electrical insulating layer) inherent to the electrical insulating layer, many requests have been raised from users for a method of three-dimensionally arranging conductor circuits while a gas having a lowest specific dielectric constant is used as an electrical insulating layer.

SUMMARY OF THE INVENTION

The present invention has been made with the foregoing background in mind.

An object of the present invention is to provide a method of producing a three-dimensional wiring board which assures that arbitrary three-dimensional conductor circuits can be formed on the surface of an electrical insulating material having a three-dimensional structure.

Another object of the present invention is to provide a method of producing a three-dimensional wiring board wherein conductor circuits on the front and rear surfaces of the wiring board are electrically connected to each other at predetermined positions.

Further object of the present invention is to provide an electronic circuit module including a three-dimensional wiring board wherein the electronic wiring module assures that signals are processed at a high speed while a gas or the like having a lowest specific dielectric constant among dielectrics is used as an electrical insulating layer.

According to one aspect of the present invention, there is provided a method of producing a three-dimensional wiring board wherein the method comprises a step of selectively forming conductor layers at predetermined positions on a molding surface of at least one of an upper die half and a lower die half constituting a molding die with small projections disposed on the molding surface of the same to form a predetermined number of conductor circuits each including small projections, a step of forming conductor layers on a molding surface of the other die half of the molding die at the positions corresponding to those on the molding surface of the one die half of the same to form a predetermined number of conductor circuits, a step of bringing the molding surfaces of both the die halves in pressure contact with each other to electrically connect the projections of the conductor circuits on the one die half to the corresponding conductor circuits on the other die half of the molding die, a step of filling the hollow space between both the die halves with a predetermined resin while the conductor circuits on both the die halves are electrically connected to each other via the projections at the predetermined positions, and moreover, reversely securing the conductor circuits on both the die halves to the surface of a molded product, and a step of removing the filled resin from the molded product by dissolving the same after the molded product having the conductor circuits reversely secured thereto is removed form the molding die and a predetermined number of electronic components are assembled on the molded product.

In addition, according to other aspect of the present invention, there is provided an electronic circuit module including a three-dimensional wiring plate produced by employing the method of the present invention, wherein a predetermined number of electronic components are assembled on the three-dimensional wiring board reinforced by filling with a foamed resin the space assumed by the resin of the molded product which has been removed by dissolving the resin.

To perform the step of selectively forming conductor layers, it is preferable to employ a process of electrically plating with an electrical conductive metallic material.

According to the present invention, when the molding surfaces of both the upper and lower die halves of the molding die are brought in pressure contact with each other, a high intensity of force appears between the conductor circuits each including small projections on the molding surface of at least one of the upper and lower die halves and the corresponding conductor circuits on the molding surface of the other die half of the molding die, whereby plastic deformation occurs on the molding surface on the other die half corresponding to the conductor circuits each including small projections on the one die half of the molding die, resulting in the conductor circuits on both the die halves being firmly electrically connected to each other. After completion of the pressure contact, a predetermined resin is filled in the hollow space between the conductor circuits on both the die halves of the molding die so that the conductor circuits are reversely secured to or embedded in a molded product. Thus, the conductor circuits on the front and rear surfaces of the molded product are electrically connected each other at predetermined positions. Consequently, a three-dimensional wiring board having a multi-layered structure can be produced easily.

In addition, an electronic circuit module having a high signal processing speed can be produced with a gas serving as an electrical insulating layer by removing the electrical insulting resin by dissolving the same after a predetermined number of electronic components are assembled on the conductor circuits of the three-dimensional wiring board.

DESCRIPTION OF THE PREFERRED EMBODIMENT

Now, the present invention will be described in detail hereinafter with reference to the accompanying drawings which illustrate a preferred embodiment of the present invention.

FIG. 1 to FIG. 5 are sectional views which schematically illustrate a series of steps to be performed to practice a method of producing a three-dimensional wiring board in accordance with the embodiment of the present invention, respectively.

Figure 1:
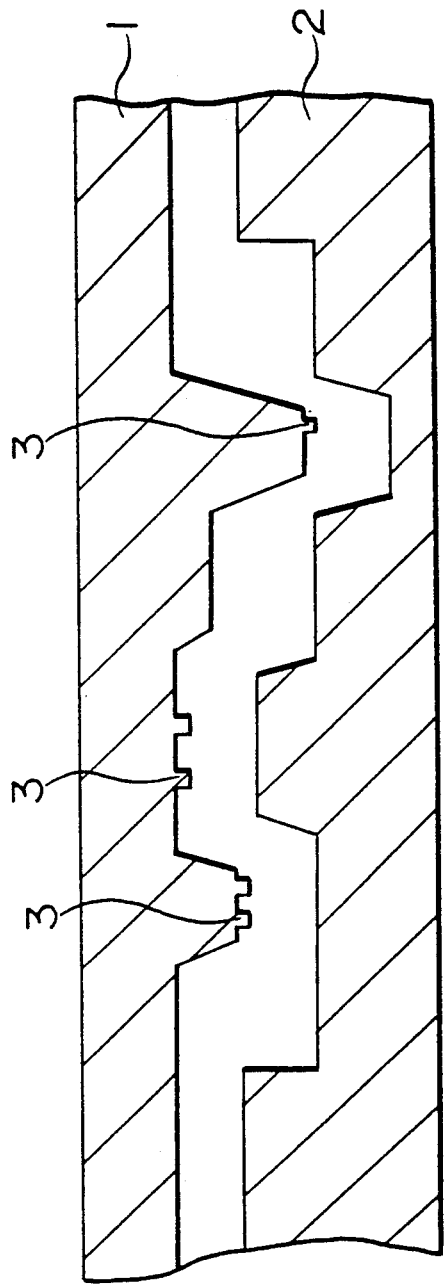
FIG. 1 is a sectional view which illustrates by way of example the structure of a molding die to be used for practicing method of producing a three-dimensional wiring board in accordance with the embodiment of the present invention.

According to the present invention, first of all, it is necessary to prepare a molding die consisting of an upper die half 1 having a three-dimensional molding surface and a lower die half 2 having a three-dimensional molding surface corresponding to that of the upper die half 1, as shown in FIG. 1. With the molding die constructed in the above-described manner, a molded product having a three-dimensional configuration can be obtained using the three-dimensional molding surfaces of the upper and lower die halves 1 and 2.

As shown in the drawings, a plurality of small projections 3 each having a low height are previously arranged at predetermined locations on the molding surface of the upper die half 1.

Figure 2:
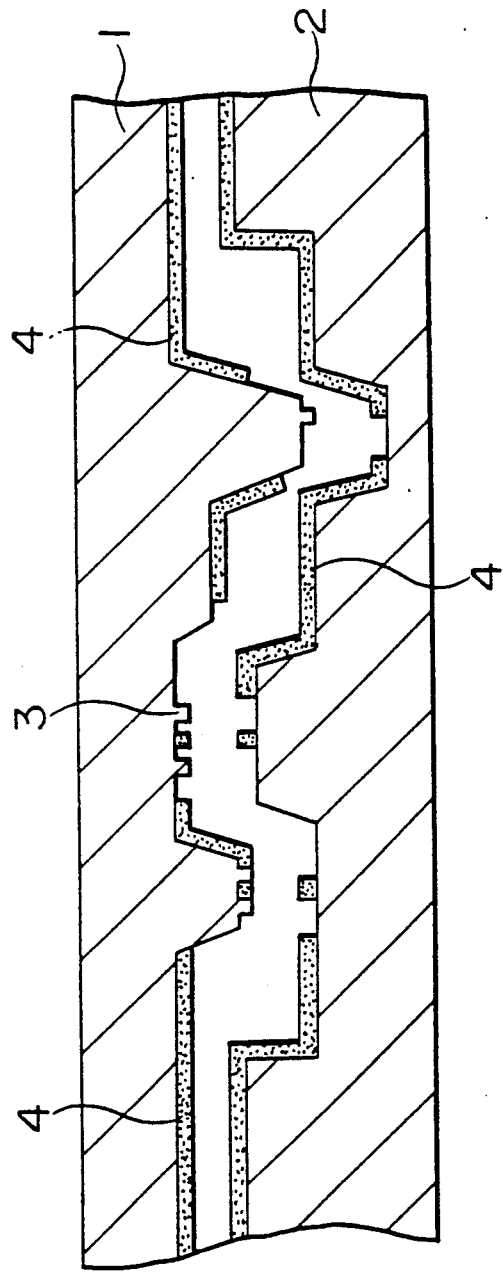
FIG. 2 is a sectional view which schematically illustrates the state that a plating resist layer is adhesively formed on a molding surface of the molding die shown in FIG. 1.
Figure 3:
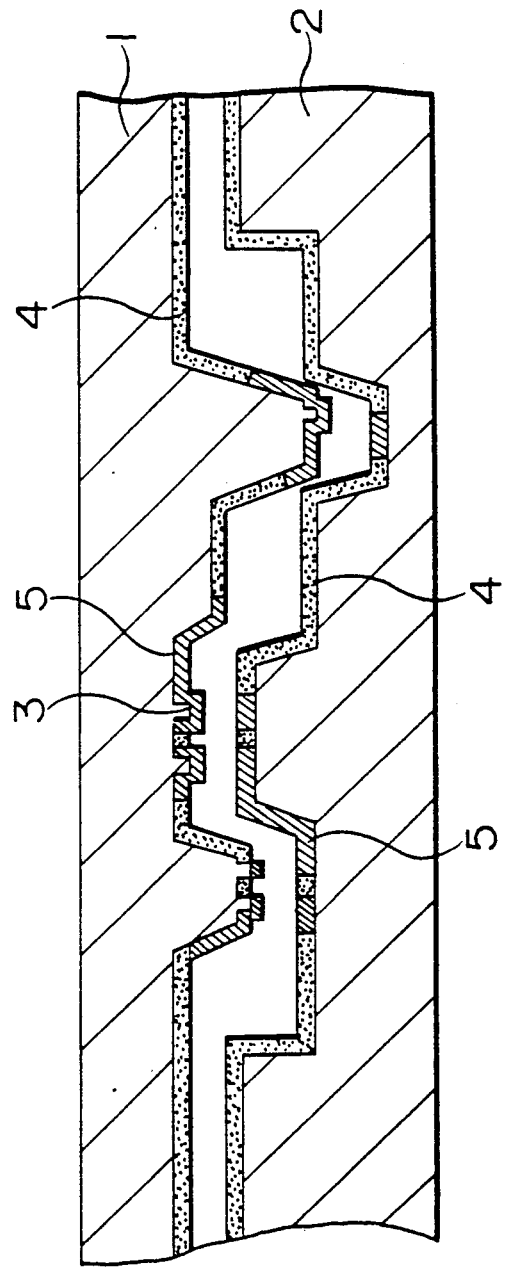
FIG. 3 is a sectional view which schematically illustrates the state that copper plated layers (conductor circuits) are selectively formed on a molding surface of the molding die shown in FIG. 2.

Next, as shown in the sectional view of FIG. 2, a plurality of plating resist layers 4 are deposited on the molding surfaces of the upper and lower die halves 1 and 2. Specifically, an electrically insulating inorganic film, e.g., a film of alumina, silica, amorphous carbon or the like is adhesively formed on each of the molding surfaces of the upper and lower die halves 1 and 2 by employing a chemical vaporizing deposition process, a physical vaporizing deposition process or the like, and thereafter, some part of the film is selectively removed therefrom by scraping from each of the molding surfaces of the upper and lower die halves 1 and 2 by e.g., a diamond needle. It may be removed therefrom by irradiating a laser light beam outputted from an optical system (not shown). Subsequently, the molding surfaces of the upper and lower die halves 1 and 2 each having a shape corresponding to a required conductor circuit are selectively exposed, whereby the remaining electrical insulating inorganic film each having a reverse pattern are used as a plating resist layer 4.

Next, the upper and lower die halves 1 and 2 of the molding die are immersed in a copper sulfate plating bath to perform a copper plating operation under a condition that each of the upper and lower die halves 1 and 2 is used as an electrode (cathode) while a copper block (not shown) is used as an opponent electrode (anode). After completion of the plating operation, a plurality of copper plated layers 5 each serving as a conductor circuit are deposited in the regions on the exposed molding surfaces of the upper and lower die halves 1 and 2, as shown in the sectional view of FIG. 3.

Figure 4:
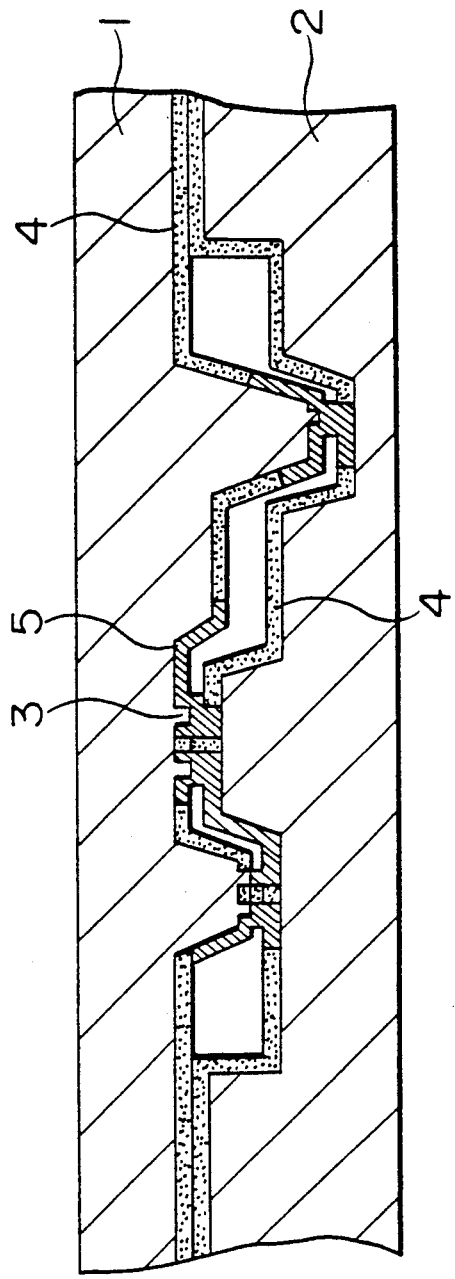
FIG. 4 is a sectional view which schematically illustrates the state that the copper plated layers are partially connected when the molding surfaces of the upper and lower die halves of the molding die shown in FIG. 3 are brought in engagement with each other.
Figure 5:
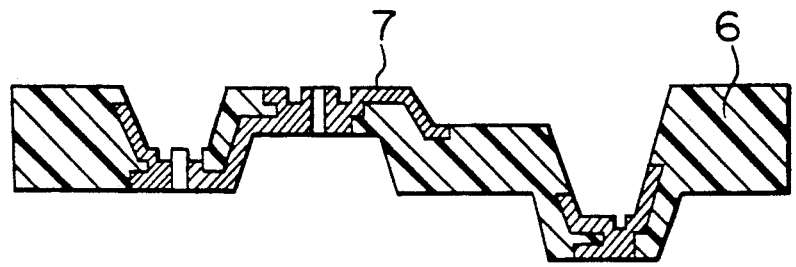
FIG. 5 is a fragmentary sectional view which illustrates by way of example the structure of an essential part of the three-dimensional wiring board produced by employing the method of the present invention.

Next, as shown in the sectional view of FIG. 4, the molding surface of the upper die half 1 is brought in pressure contact with the molding surface of the lower die half 2. At this time, the copper plated layer 5 including the small projections 3 on the molding surface of upper die half 1 are brought in pressure contact with the copper plated layer 5 on the molding surface of lower die half 2. A portion on the lower die half 2 to be applied with pressure contact corresponds to those on the upper die half 1 to serve as a conduction circuit, and pressure contact is under a condition that plastic deformation is caused therebetween whereby the copper plated layers 5 each having small projections 3 on the molding surface of the upper die half 1 come in contact with the copper plated layers 5 on the molding surface of the lower die half 2 at the predetermined positions, causing an integral structure to be built with them.

Specifically, in a case where each projection 3 is formed in the cylindrical column-shaped configuration and dimensioned to have a diameter of 200 microns and a height of 400 microns while its circumferential surface is surrounded by the copper plated layer 5 having a thickness of 20 microns, and moreover, the copper plated layers 5 each serving as a conductor circuit while having a thickness of 20 microns are formed on the molding surface of the lower die half 2, the copper plated layers 5 on the molding surface of the upper die half 1 are brought in pressure contact with the copper plated layers 5 on the molding surface of the lower die half 2 of the molding die in such a manner that the gap present between the lower end of each projection 3 and the opponent location on the lower die half 2 (i.e., the gap appearing therebetween with the copper plates layer 5 removed therefrom) is set to about 20 microns. In practice, when the copper plated layers 5 on the molding surface of the upper die half 1 are brought in pressure contact with the copper plated layers 5 on the molding surface of the lower die half 2 of the molding die while the aforementioned condition is maintained, a stress of about 2 t/cm² is exerted not only on the projections 3 on the upper die half 1 but also on the corresponding locations on the lower die half 2 so that firm connection is established between the copper plated layers 5 on the upper die half 1 and the copper plated layers 5 on the lower die halve 2 on the molding die at the selected positions.

Next, the hollow space (cavity) formed between the upper and lower die halves 1 and 2, i.e, the hollow space defined between the conductor circuits on the molding surfaces of the upper and lower die halves 1 and 2 of the molding die is filled with an electrically insulating resin such as a thermoplastic resin or the like by employing an injection molding process or the like. After the filled resin is cooled, the upper die half 1 is parted away from the lower die half 2 and vice verse, so that a molded product having copper plated layers 5 each serving as a conductor circuit embedded on the surface of the molded product is obtained. Specifically, as shown in the sectional view of FIG. 5, a three-dimensional wiring board is obtained such that a plurality of conductor circuits 7 are integrated with a molded product of an electrical insulating resin 6 along the front and rear surfaces thereof, and moreover, these conductor circuits 7 are electrically connected to each other at the predetermined positions (corresponding to the projections 3 on the upper die half 1 of the molding die).

As is apparent from the above description, when the method of the present invention is employed, a plating resist layer 4 constructed of an electrical insulating inorganic film with a reverse pattern can semipermanently be used as a mask required for performing a copper plating operation. Thus, a three-dimensional wiring board having the conductor circuits 7 formed therein at a high accuracy can economically be produced with excellent reproducibility by repeatedly practicing a simple process comprising a step of copper plating at a high speed and a step of resin molding. In contrast with a conventional wiring board of which front and rear surfaces are required to form a land around each hole (through hole) by way of which conductor circuits arranged on the front and rear surfaces of the wiring board are electrically connected to each other, according to the present invention, conductor circuits 7 arranged on the opposite surfaces of a wiring board can reliably electrically be connected to each other without any necessity for forming lands of the aforementioned type, because both the upper and lower die halves 1 and 2 of the molding die can be fabricated at a high accuracy using a metallic material, and moreover, a positional error appearing between upper and lower patterns can be minimized. Consequently, the method of the present invention makes it possible to realize not only arrangement of wiring conductors at a high density but also practical assembly of electronic components at a high density.

In the aforementioned embodiment, a plurality of small projections 3 are formed only on the molding surface of the upper die half 1 of the molding die. Alternatively, a plurality of projections 3 of the foregoing type may be formed only on the molding surface of the lower die half 2. In addition, a plurality of projections 3 may be formed on the molding surfaces of both the upper and lower die halves 1 and 2 of the molding die. The three-dimensional wiring board obtained in the above-described manner can be used for constructing an electronic circuit module as it is, after a predetermined number of electronic components are assembled on the conductor circuits on the opposite surface of the three-dimensional wiring board by employing a conventional process such as soldering or the like. In addition, a three-dimensional wiring board having a multi-layered structure such as a three-layered structure, a four-layered structure or the like with a plurality of conductor circuits 7 arranged in each layer can be obtained by repeatedly placing the three-dimensional wiring board on the molding surfaces of the upper and lower die halves 1 and 2 each electrically plated with a copper in the same manner as mentioned above and then performing a molding operation for each layer. Further, by repeating the aforementioned steps, a three-dimensional wiring board having the number of layers more than that of the aforementioned multi-layered structure can be produced.

Figure 6:
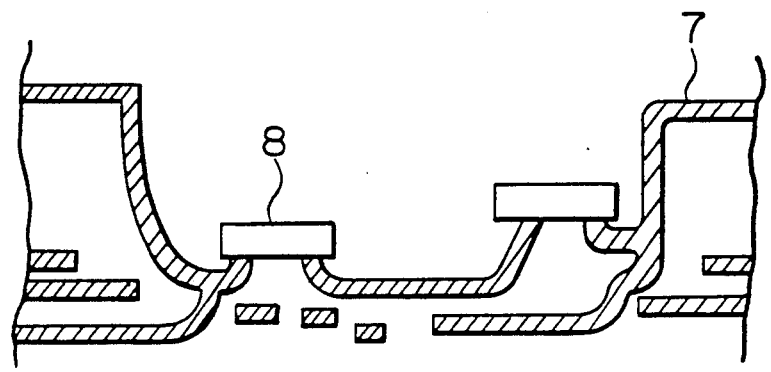
FIG. 6 is a fragmentary sectional view which illustrates by way of example an essential part of an electronic circuit module for which the three-dimensional wiring board produced by employing the method of the present invention is used.

In addition, an electronic circuit module as shown in the sectional view of FIG. 6 which assures that signals are processed at a high speed can be obtained by dissolving and removing the resin constituting each electrical insulating layer, after a predetermined number of electronic components are assembled on the three-dimensional wiring board as constructed in the above-described manner. Specifically, for example, in a case where a resin to be molded is a polysulfone resin, an electronic circuit module having electronic components 8 assembled thereon after completion of a three-dimensional wiring operation with a gas used as an electrical insulating layer is obtained by dissolving the polysulfon resin in a solvent such as a 1,1,2,2- tetrachloroethane to remove the same from the three-dimensional wiring board.

Figure 7:
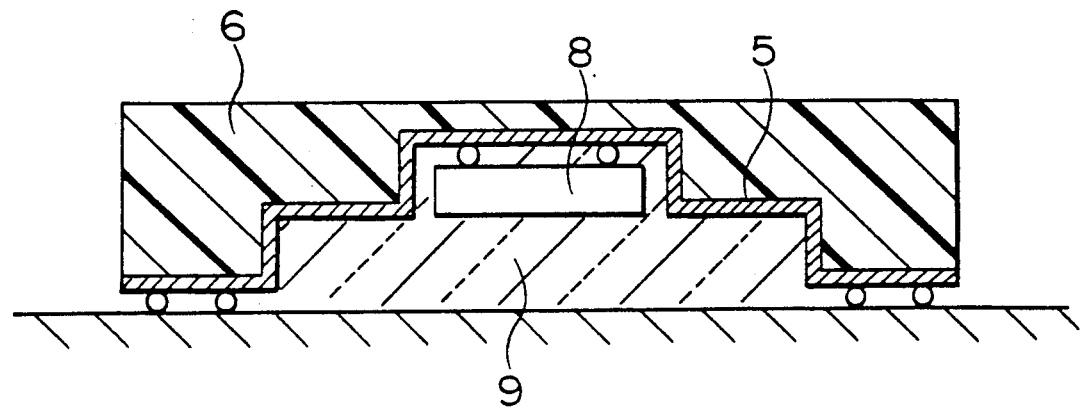
FIG. 7 is a fragmentary sectional view which illustrates by way of example the structure of an essential part of the electronic circuit module of which hollow space is filled with a foamed resin.

The electronic circuit module for which a three-dimensional wiring operation has been performed with a gas used as an electrical insulating layer can be used without any functional trouble as it is. However, in a case where it is necessary that the electronic circuit module is mechanically reinforced, it is recommended that the electronic circuit module is electrically insulated with a very porous material having a low dielectric constant by filling the space between adjacent conductor circuits with, e.g., a polyethylene resin containing a foaming agent and then heating the filled resin to enlarge the same by a quantity of about twenty times by foaming. FIG. 7 illustrates by way of example an electronic circuit module which is electrically insulated by using a foamed resin. In the case shown in FIG. 7, first, electronic components 8 are assembled on the bottom of a recess of the conductor circuit 5 formed on the surface of an electrical insulating resin 6 composed of a polysulfon resin. Subsequently, an electrical insulating resin 6 having the electronic components 8 incorporated therein with a hollow space is assembled on a printed circuit board while the electronic components 8 are turned upside down, and thereafter, a polyethylene resin 9 enlarged about twenty times by foaming is filled in the hollow space of the electrical insulating resin 6 between conductor circuit 5 and the illustrated supporting surface. Finally, the electrical insulating resin 6 is immersed in a solvent of 1,1,2,2- tetrachloroethane so as to dissolve it in the solvent, whereby production of an electronic circuit module having three-dimensional wiring operations performed therefor is completed.

The electronic circuit module electrically insulated with a porous or very porous material having a low dielectric constant as mentioned above has a signal processing speed as high as about two times compared with a conventional multi-layered wiring board having a glass-epoxy laminated material or the like used as an electrical insulating layer.

What is claimed is:

1. A method of producing a three-dimensional wiring board, comprising the steps of:

selectively forming conductor layers at a plurality of positions on a molding surface of one die half of an upper die half and a lower die half constituting a molding die with projections disposed on said molding surface to form a plurality of conductor circuits each including the projections, forming conductor layers on a molding surface of a die half of the upper and lower die halves other than said one die half of said molding die at a plurality of positions corresponding to the positions on said molding surface of said one die half to form a plurality of conductor circuits, bringing the molding surfaces of both of said die halves in pressure contact with each other to electrically connect the projections of the conductor circuits on the molding surface of said one die half to the corresponding conductor circuits on the other die half of the molding die and to leave a hollow space surrounding the projections, and filling the hollow space between both the die halves with a resin while the conductor circuits on both the die halves are electrically connected to each other via the projections at said plurality of positions, and transferring and securing to a surface of a product the conductor circuits on the molding surfaces of both of the die halves.

2. A method of producing a three-dimensional wiring board, comprising the steps of:

selectively forming conductor layers at a plurality of positions on a molding surface of one die half of an upper die half and a lower die half constituting a molding die with projections disposed on said molding surface to form a plurality of conductor circuits each including the projections, forming conductor layers on a molding surface of a die half of the upper and lower die halves other than said one die half of said molding die at a plurality of positions corresponding to the positions on said molding surface of said one die half to form a plurality of conductor circuits, bringing the molding surfaces of both of said die halves in pressure contact with each other to electrically connect the projections of the conductor circuits on the molding surface of said one die half to the corresponding conductor circuits on the other die half of the molding die and to leave a hollow space surrounding the projections, filling the hollow space between both the die halves with a resin while the conductor circuits on both the die halves are electrically connected to each other via the projections at said plurality of positions, and transferring and securing to a surface of a product the conductor circuits on the molding surfaces of both of the die halves, and removing said resin from said product by dissolving the same after the pluralities of conductor circuits are reversely secured to said product.

3. A method of producing a three-dimensional wiring board, comprising the steps of:

selectively forming conductor layers at a plurality of positions on a molding surface of one die half of an upper die half and a lower die half constituting a molding die with projections disposed on said molding surface to form a plurality of conductor circuits each including the projections, forming conductor layers on a molding surface of a die half of the upper and lower die halves other than said one die half of said molding die at a plurality of positions corresponding to the positions on said molding surface of said one die half to form a plurality of conductor circuits, bringing the molding surfaces of both of said die halves in pressure contact with each other to electrically connect the projections of the conductor circuits on the molding surface of said one die half to the corresponding conductor circuits on the other die half of the molding die and to leave a hollow space surrounding the projections, and filling the hollow space between both the die halves with a first resin while the conductor circuits on both the die halves are electrically connected to each other via the projections at said plurality of positions, and transferring and securing to a surface of a product the conductor circuits on the molding surfaces of both of the die halves, removing the product having the pluralities of conductor circuits secured thereto from the molding die, removing said first resin from the removed product by dissolving said first resin, and refilling the hollow space with a foamed resin.

4. The method according to claim 1, wherein forming said conductor layers comprises electrically plating at least one of said molding surfaces with an electrically conductive metallic material.

5. The method according to claim 2, wherein forming said conductor layers comprises electrically plating at least one of said molding surfaces with an electrically conductive metallic material.

6. The method according to claim 3, wherein forming said conductor layers comprises electrically plating at least one of said molding surfaces with an electrically conductive metallic material.

7. The method according to claim 1, wherein the selectively forming step comprises forming the conductor layers at the plurality of positions on the molding surface of said one die half with projections thereon and at an additional plurality of positions on the other die half with projections thereon, said additional plurality of positions not corresponding to the aforesaid plurality of positions, and the forming step comprises forming conductor layers on the molding surface of the other die half without projections thereon at a plurality of positions corresponding to the aforesaid plurality of positions on said molding surface of said one die half with projections thereon, and forming conductor layers on said one die half without projections thereon at a plurality of positions corresponding to said additional plurality of positions of the other die half with projections thereon.

8. The method according to claim 7, wherein forming conductor layers comprises electrically plating both of said molding surfaces with an electrically conductive metallic material.

* * * * *